United States Patent [19]
Brand

[11] 3,979,765
[45] Sept. 7, 1976

[54] SILICON GATE MOS DEVICE AND METHOD

[75] Inventor: Warren L. Brand, Saratoga, Calif.

[73] Assignee: Signetics Corporation, Sunnyvale, Calif.

[22] Filed: Mar. 7, 1974

[21] Appl. No.: 448,893

[52] U.S. Cl. .............................. 357/23; 357/41; 357/49; 357/52; 357/55; 357/59
[51] Int. Cl.² ............... H01L 29/78; H01L 27/02; H01L 29/04; H01L 27/12
[58] Field of Search ............... 357/23, 41, 49, 52, 357/55, 59

[56] References Cited
UNITED STATES PATENTS

| | | | |
|---|---|---|---|
| 3,748,187 | 7/1973 | Aubuchon et al. | 357/41 |
| 3,751,722 | 8/1973 | Richman | 357/23 |
| 3,752,711 | 8/1973 | Kooi et al. | 357/23 |
| 3,849,216 | 11/1974 | Salters | 357/23 |
| 3,873,383 | 3/1975 | Kooi | 357/41 |

*Primary Examiner*—Edward J. Wojciechowicz
*Attorney, Agent, or Firm*—C. Richard Pfeiffer; William H. Dana

[57] ABSTRACT

A MOS semiconductor device and method for forming same, including a semiconductor body of first conductivity type having a planar surface, said body having spaced grooves therein opening through said surface with insulating material filling said grooves and extending to the surface of said body. Spaced source and drain regions of second conductivity type are formed in the body in areas between said grooves filled with insulating material extending to the surface, and providing a channel region therebetween. An insulating layer is formed on said surface, and having a portion of relatively precise thickness overlying the channel region. A layer of semiconductor material is formed on said portion of the insulating layer, a protective layer formed on said insulating layer and said layer of semiconductor material, and lead means formed on said protective layer and extending through said protective layer to contact said source and drain regions and said semiconductor layer.

9 Claims, 11 Drawing Figures

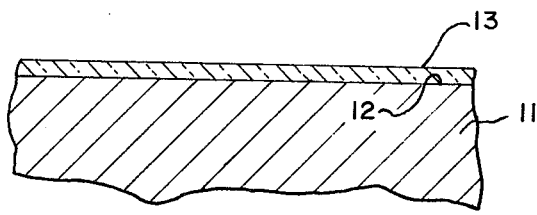
FIG.—1
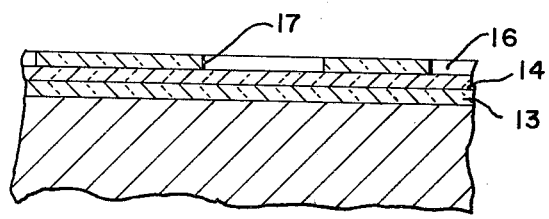
FIG.—2
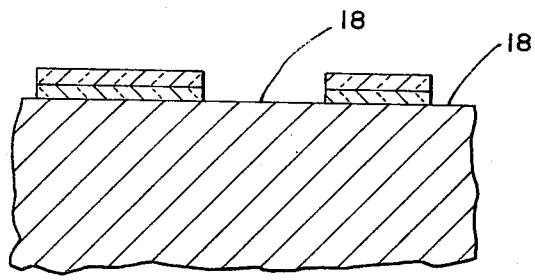
FIG.—3
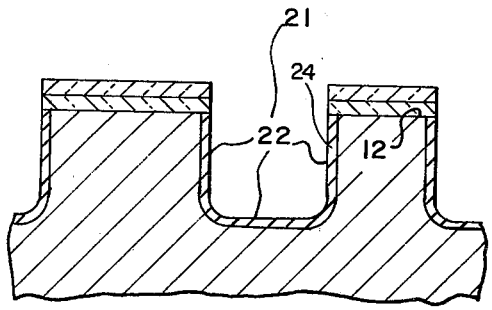
FIG.—4
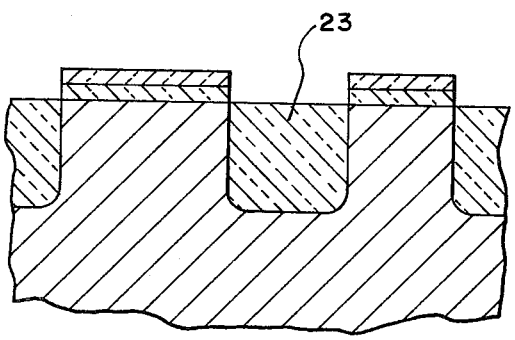
FIG.—5
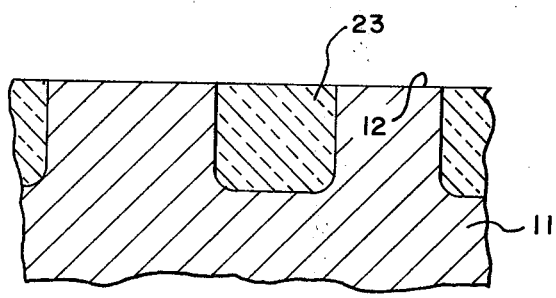
FIG.—6
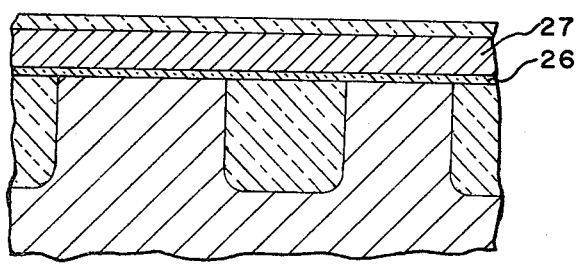
FIG.—7
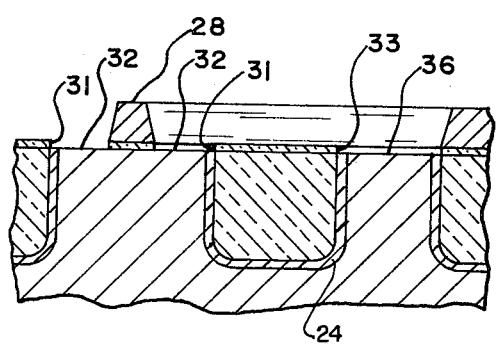
FIG.—8

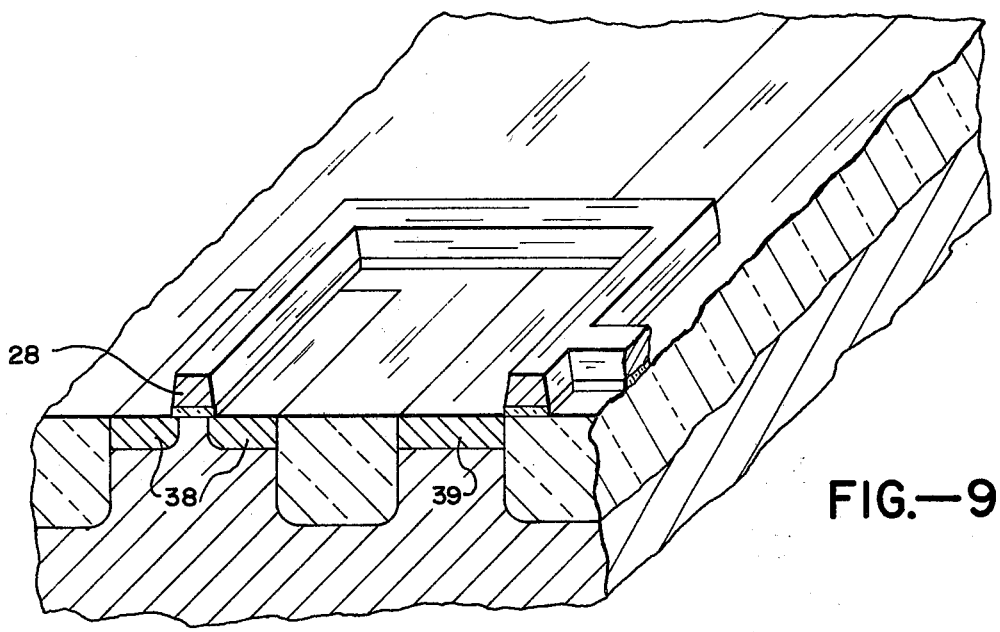
FIG.—9
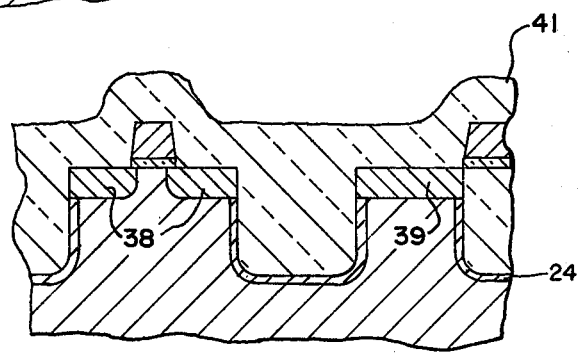
FIG.—10
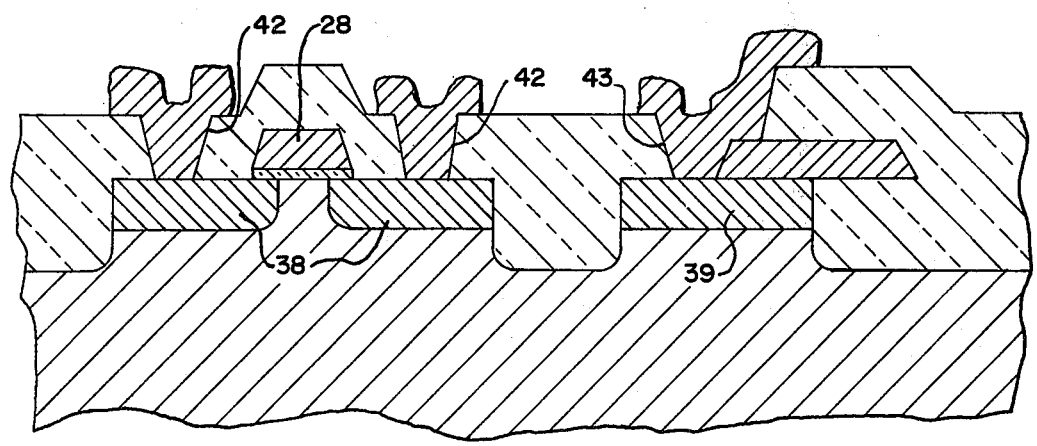
FIG.—11

SILICON GATE MOS DEVICE AND METHOD

BACKGROUND OF THE INVENTION

Although silicon gate semiconductor devices heretofore have been provided, the fabrication process has been excessively complex, larger wafer areas have been required, and multiple physical step heights have been required in the wafer topography. There is a need for an MOS semiconductor device of reduced size and having fewer physical step heights and improved yields. Further there is a need for simplifying the processing steps to achieve fewer physical step heights and reducing the number of masking and other processing steps.

SUMMARY OF THE INVENTION AND OBJECTS

A MOS semiconductor device and method for forming same, including a semiconductor body of first conductivity type having a planar surface, said body having spaced grooves therein opening through said surface with insulating material filling said grooves and extending to the surface of said body. Spaced source and drain regions of second conductivity type are formed in the body in areas between said grooves filled with insulating material extending to the surface, and providing a channel region therebetween. An insulating layer is formed on said portion of the insulating layer, a protective layer is formed on said insulating layer and said layer of semiconductor material, and lead means is formed on said protective layer and extending through said protective layer to contact said source and drain regions and said semiconductor layer.

In general, it is an object of the present invention to provide an MOS semiconductor device of reduced size, simplified topography and improved yield.

Another object of the invention is to provide an MOS semiconductor device having reduced junction size, fewer poly-crystalline silicon gate physical step heights, an increased $BV_{DS}$ by eliminating field doping in P channel devices and a device having a very high $V^F_{th}$ to $V_{TH}$ ratio.

Another object of the invention is to provide a simplified method for fabricating an MOS semiconductor device.

Another object of the invention is to provide a simplified method for fabricating a MOS device reducing the number of masking steps, eliminating the field oxide step, and eliminating the N+ field doping steps in P channel devices.

Additional objects and features of the invention will appear from the following description of the preferred embodiments.

BRIEF DESCRIPTION OF THE DRAWINGS

FIGS. 1–8, 10 and 11 are cross-sectional views of a portion of a semiconductor body showing the processing steps in accord with the present invention.

FIG. 9 is a cross-sectional isometric view of a portion of a semiconductor body showing the silicon gate device in accord with the present invention.

DESCRIPTION OF THE PREFERRED EMBODIMENTS

The first step in forming the MOS semiconductor device is providing a silicon body 11 having a planar surface 12, FIG. 1. The surface 12 may be in (111) or (100) crystal planes and may have a range for a P channel device from 5–10 ohm-cm., and a range for an N channel device from 3–30 ohm-cm. The crystal orientation and choice of either P-channel or N-channel device will of course affect the threshold of the semiconductor device. The threshold equation may be expressed as:

$$V_T = \phi_{MS} + \phi_B - \frac{Q_{ox}}{C_{ox}} - \frac{Q_b}{C_{ox}}$$

where $\phi_{MS}$ is the metal to silicon work function, $\phi_B$ is the potential that corresponds to the band bending and inversion, $Q_b$ is the charge contribution of the body depletion region, $C_{ox}$ is the gate oxide capacitance. $C_i$ may be used in place of $C_{ox}$ for the more general case where the dielectric is other than silicon dioxide.

$\phi$ is a function of the gate electrode material, and to a slight degree, a function of the body doping level. $\phi_B$ is also a varying function of the doping level, often combined with $\phi_{MS}$ since the sum of the two is nearly constant for a given gate electrode system. $Q_{ox}$ is principally a function of the crystal orientation of the body, and may also be the function of oxidation and annealing conditions. $Q_b$ is a function of the body doping level where the range of surface concentrations is limited by practical considerations of junction breakdown voltage and depletion region spreading. $Q_b$ is not a strong controlling factor for $V_t$ for conventional P channel technology, in general, although by using ion implantation a low $V_t$ can be obtained on normally high threshold, (111), silicon material. Briefly, in this process the ion implantation step is performed prior to the contact masking step, where boron ions are implanted through the gate oxide to compensate the doping of the transistor channel regions. Because of the thick field oxide in regions other than the thin gate oxide, the boron ions do not penetrate as far in the silicon body as they penetrate in the immediate area underlying the gate oxide.

The threshold equation above may be used to calculate the ion dosage required to achieve a low $V_t$ in (111) silicon and the net charge density that must be implanted thereby determined. Then the impurity doping density may be determined. The actually implanted dose may, in practice, need to be somewhat higher because all implanted ions may not become electrically active in the silicon lattice.

Once the desired starting body is determined, a relatively thin protective layer is formed on planar surface 12 of said body 11 in FIG. 1. The protective layer may be thermally formed thus may be silicon dioxide. The protective layer 13 protects the surface 12 from direct contact with the subsequently formed silicon nitride layer. Silicon nitride contact with the silicon body can degrade the quality and characteristics of subsequently formed semiconductor junctions.

Next a relatively thin layer 14 of silicon nitride $Si_3N_4$, is formed on the surface of protective layer 13, FIG. 2. The silicon nitride may be deposited from the combination of $NH_3$ and $SiH_4$. Next a relatively thin masking layer 16 is formed on the upper surface of the silicon nitride layer 14. The silicon nitride layer 14 and the masking layer 16 may be conventionally formed, in sequence, in an epitaxial reactor.

Next apertures 17 are formed in masking layer 16. The exposed portions of the silicon nitride layer 14 are then removed, such as by etching, FIG. 3. Next the underlying portions of the protective layer 13 are removed such as by etching to expose portions of the upper surface 12 of body 11. The masking layer 16 is then removed such as by etching.

Referring to FIG. 4, the silicon nitride layer 14 and layer 13 are then used as a mask to form grooves 21 in the exposed portions of the silicon body 11 and extending through surface 12. The grooves in the body 11 may be formed by chemical etching with little or no undercutting. If the substrate material is (100) oriented and an anisotropic silicon etch is used no or negligible undercutting will be observed. In (111) oriented material a $HNO_3$ and $NH_4F$ etch may be used, and produces little undercutting.

Still referring to FIG. 4, for an N channel device a P+ pre-deposition may now be advantageously performed to prevent oxide charge from inverting the field. This may be accomplished by forming a relatively thin P+ doping layer 24 at the exposed silicon body surfaces 22 in grooves 21. In the case of P channel devices no doping is necessary and the elimination of N+ field doping yields a device having a higher $BV_{DS}$, that is a higher breakdown voltage between drain and source regions.

Next insulating material such as field oxide 23 is formed in grooves 21 extending to the surface of body 11, FIG. 5. The areas under the silicon nitride layer 14 and protective layer 13 are protected from oxidation during this process. If thermal oxidation is used this process also serves to drive in the P+ doping in the field or grooves 21 in the case for N channel devices.

The silicon nitride layer 14 is next selectively removed such as by using $H_3PO_4$, FIG. 6. Next the protective layer 13 and insulating material 23 in grooves 21 is removed flush with the planar surface 12 of the body 11.

Next a relatively thin insulating layer 26 is formed on planar surface 12, FIG. 7. The layer may be formed of silicon dioxide. Next a relatively thick semiconductor layer 27 is formed on insulating layer 26. The semiconductor layer may of the form of poly-crystalline silicon deposited from $SiH_4$. Next the semiconductor layer 27 is patterned to form a gate electrode 28 in a portion of said layer and intermediate grooves 21 having insulating material 23 formed therein. Next portions of insulating layer 26 spaced by gate electrode 28 are removed to provide apertures 31 exposing upper surface portions 32 of body 12 FIG. 8. Simultaneously apertures 33 may be formed in insulating layer 26 to expose surface portions 36, to provide conducting regions within the body 11 to form interconnecting paths should they be desired.

Spaced source and drain regions 38 are next formed in the upper surface portions 32 of surface 12 spaced by gate electrode 28, FIG. 9. If diffusion is used said regions 38 may underly a portion of gate electrode 28 and the insulating layer or gate oxide spaced therebetween. Simultaneously diffused region 39 may be formed as an interconnecting path within the body. The spaced source and drain regions 38 and conductive region 39 are formed by introducing impurities which provide second conductivity regions when introduced in first conductivity body 11. Next a top protective layer 41 is formed on said body, which may be silicon dioxide.

The next processing step of forming apertures 42 in top protective layer 41 is shown in FIG. 11. The apertures expose spaced source and drain regions 38. Simultaneously an aperture 43 may be formed to expose a portion of the patterned semiconductor layer to thereby obtain a contact with gate 28. Similar apertures may be provided to expose portions of the conductive region 39 formed within the substrate 11. Next lead means are formed on conductive layer 41 extending through said respective apertures 42 and 43 to contact said regions and said semiconductor layer. Lead means may be a patterned metallization layer, such as aluminum which is then subsequently patterned to provide the desired circuit interconnections.

Thus it is apparent that there has been provided an MOS semiconductor device of reduced size, simplified topography and improved yield. Specifically a device having reduced junction size is provided where the semiconductor junction characteristics are protected from contact with the silicon nitride processing layer. Moreover fewer poly-crystalline silicon gate physical step heights are required. Increased $BV_{DS}$ and a very high $V^F{}_{TH}$ to $V_{TH}$ ratio are also provided. A simplified method for fabricating the MOS device reduces masking steps, eliminates the field oxide step and the N+ field doping in P channel devices.

I claim:

1. In an MOS semiconductor device, a semiconductor body of first conductivity type having a planar surface, said body having spaced grooves therein opening through said surface, insulating material filling said grooves and extending to the planar surface of said body to form in combination with said body surface a continuous planar surface substantially free of physical step heights, spaced source and drain regions of second conductivity type formed in the body and extending to the surface in areas between said grooves filled with insulating material and providing a channel region therebetween, a relatively thin insulating layer formed on said surface and having a portion of relatively uniform thickness overlying the channel region, said thin insulating layer having substantially planar top and bottom surfaces, a layer of semiconductor material formed on a portion of said insulating layer, the bottom of said semiconductor layer having a planar surface, said semiconductor layer being delineated to form gate electrode portions overlying said channel region and further portions providing an interconnecting layer of uniform topography, a protective layer formed on said insulating layer and said layer of semiconductor material, and lead means formed on said protective layer and extending through said protective layer to contact said source and drain regions and said semiconductor layer.

2. A semiconductor device as in claim 1 wherein said first conductivity material is P type and second conductivity material is N type semiconductor material.

3. A semiconductor device as in claim 1 wherein said body having grooves therein is formed of (100) oriented semiconductor material.

4. A semiconductor device as in claim 1 wherein said body having grooves therein is formed of (111) oriented semiconductor material.

5. A semiconductor device as in claim 1 wherein said semiconductor layer is formed of poly-crystalline silicon material.

6. A semiconductor device as in claim 1 wherein said insulating material, said insulating layer and said protective layer are silicon dioxide.

7. A semiconductor device as in claim 1 wherein said lead means are conductive paths of aluminum.

8. A semiconductor device as in claim 1 wherein said body is formed of P type material and a relatively thin P+ doping layer is formed in the walls of said grooves intermediate said P type body and said insulating material filling said grooves.

9. A semiconductor device as in claim 1 wherein said semiconductor layer is a planar layer of poly-crystalline silicon material formed on the planar surface of the insulating layer.

* * * * *